United States Patent [19]
Cazaux

[11] Patent Number: 5,283,451
[45] Date of Patent: Feb. 1, 1994

[54] OPTICAL SENSOR EXHIBITING A REDUCED SMEARING EFFECT

[75] Inventor: Yvon Cazaux, Grenoble, France

[73] Assignee: Thomson Composants Militaires et Spatiaux, Courbevoie, France

[21] Appl. No.: 856,706

[22] Filed: Mar. 24, 1992

[51] Int. Cl.$^5$ .......................................... H01L 29/796
[52] U.S. Cl. .................................. 257/229; 257/223;
257/231; 257/239; 257/246
[58] Field of Search ...................... 357/24; 377/57-63;
257/229, 222, 223, 231, 239, 246-248

[56] References Cited

U.S. PATENT DOCUMENTS

| 3,971,003 | 7/1976 | Kosonocky | 357/24 |
| 4,178,614 | 12/1979 | Sauer | 357/24 |
| 4,758,895 | 7/1988 | Elabd . | |
| 4,903,284 | 2/1990 | Esser | 357/24 |
| 5,114,237 | 5/1992 | Cazaux | 357/24 |

OTHER PUBLICATIONS

Patent Abstracts of Japan, vol. 11, No. 88 (E-490) (2535), Mar. 18, 1987, & JP-A-61-242-067, Oct. 28, 1986, N. Minotani, "Photosensor".
Patent Abstracts of Japan, vol. 5, No. 70 (E-56) (742), May 12, 1981, & JP-A-56-18-472, Feb. 21, 1981, H. Takemura, "Solid-State Image Pickup Device".

Primary Examiner—Gene M. Munson
Attorney, Agent, or Firm—Oblon, Spivak, McClelland, Maier & Neustadt

[57] ABSTRACT

The invention relates to photosensitive semiconductor devices and, more particularly, to linear arrays having several parallel rows of photoconductive points and operating in the integration and charge carry mode. In particular, the object of the invention is to reduce a smearing effect.

The device of the invention comprises a photosensitive surface (SP) divided into photosensitive surface elements (SI1 to SMn) placed in rows (L1 to Ln) and in columns (C1 to CM). Each column forms a shift register that ends in a storage space (CS1 to CSM) of a readout register (RL) formed by a shift register of the charge transfer type: readout register (RL) being on same semiconductor substrate (10) as photosensitive surface (SP) the device includes.

According to a feature of the invention, the device an intermediate zone (ZI) protected from light used to make a separation distance (DS) between photosensitive surface (SP) and readout register (RL).

6 Claims, 5 Drawing Sheets

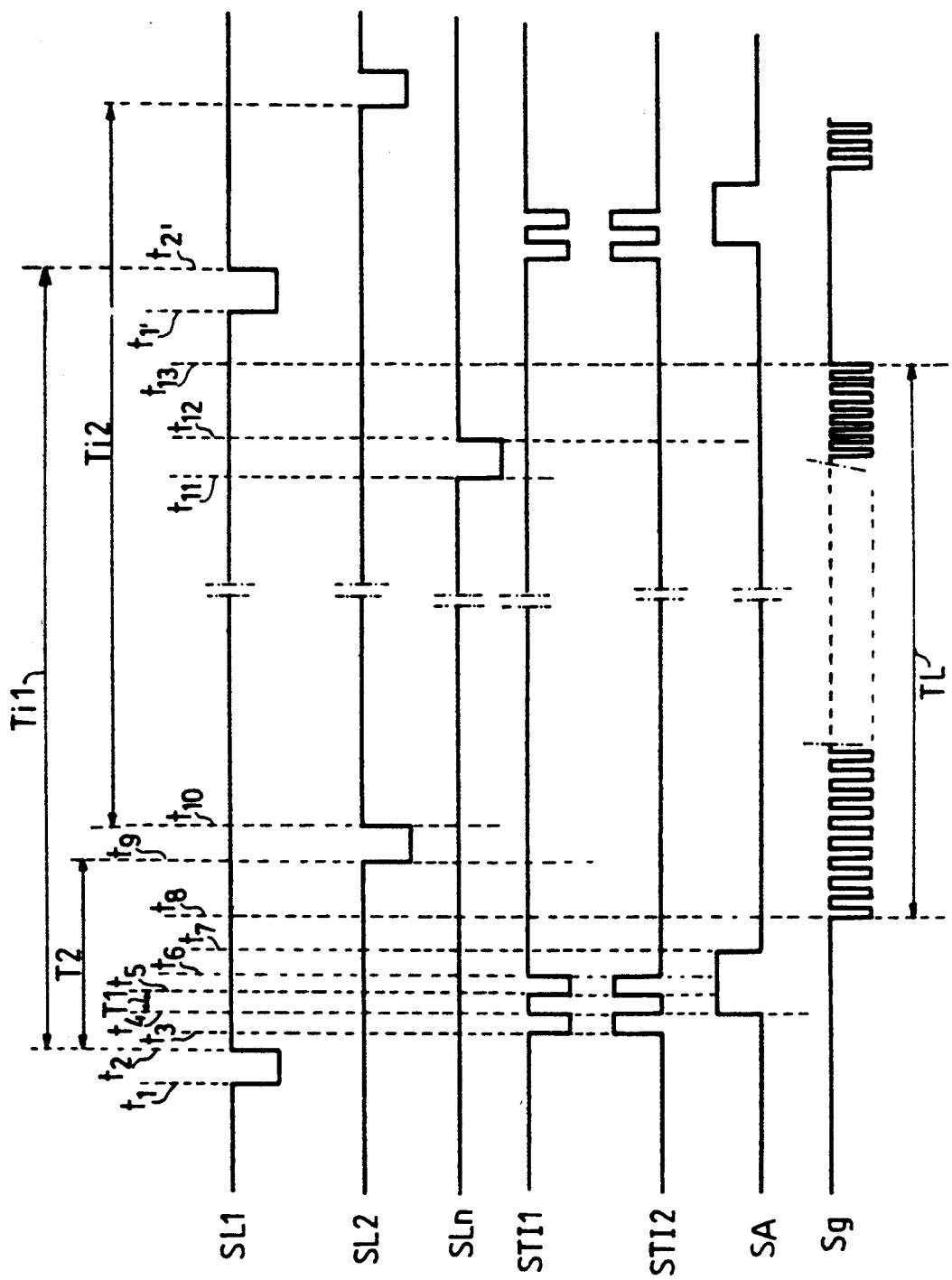

OPTICAL SENSOR EXHIBITING A REDUCED SMEARING EFFECT

BACKGROUND OF THE INVENTION

1. Field of the Invention

This invention relates to photosensitive semiconductor devices consisting of at lesat one row of photodetecting points, a row coupled to a readout register of the charge-transfer type. The invention is applicable particularly to linear arrays made of several parallel rows of photodetecting points operating in the integration and charge carry mode (abbreviated "IRC"), and it relates to means of significantly reducing the smearing effect.

2. Description of Background

FIG. 1 diagrammatically shows the conventional architecture of a photosensitive array BP of the type formed by several rows L1, L2, ..., Ln with photosensitive surface elements S1n, S2n, ..., SMn. The rows of photosensitive surface elements are parallel and these photosensitive surfaces are arranged so that they form rows L1 to Ln and columns C1 to CM perpendicular to the rows.

According to a conventional arrangement, a readout register RL (formed by a shift register operating by charge transfer) is located beside one of the ends of columns C1 to CM formed by the photosensitive surface elements belonging to first row L1. Each of these photosensitive surface elements S1 to SM of first row L1 is connected, by a gate Pl to PM, to a storage space, CS1 to CSM respectively, of readout register RL. In a conventional way, readout register RL operates, for example, in the two-phase mode, with two transfer control inputs ET1, ET2, to which there are applied control signals SC1, SC2 having phases suitable for transferring, to an output SO of the register, electrical charges that have been discharged in the latter. Output SO is connected to a readout circuit CL, conventional in the art, notably comprising an amplifier A that supplies a succession of signals (not shown) in the form of voltage, for example, each having an amplitude corresponding to the quantity of charges discharged in a space CS1 to CSM.

Each of rows L1 to Ln comprises a control input EC1 to ECn to which there are applied transfer control signals called row signals SL1 to SLn; these row signals are used to transfer, in the direction of columns C1 to CM, i.e., from rows to rows, the charges stored at the photosensitive surface elements forming these rows L1 to Ln, until these charges are discharged in storage spaces CS1 to CSM of readout register RL.

The "IRC" type of operating mode is well known in the art. It is used notably in the case of a relative linear movement between an image and photosensitive array BP. In FIG. 1, an arrow designated 3 symbolizes the shifting of the image (not represented) relative to array BP. Operation in IRC mode consists in shifting rows L1 to Ln or, more precisely, in transferring the charges accumulated at a given row L1 to Ln to a following row, synchronized with the shifting of the image and in the same direction. In this configuration, when the photosensitive surfaces of a given row are illuminated, row Ln for example, the photosensitive surfaces of this row accumulate charges during a period called integration time Ti that corresponds to the time it takes one row to analyze some of the image compared to this row of photosensitive surfaces. Then, with the relative shifting of the image and of the photosensitive array, this same row for analyzing some of the image (not shown) arrives at the level of the following row of photosensitive surfaces, i.e., row Ln-1: the charges stored in this row Ln-1 having been transferred in advance to the following row, in the direction of transfer shown by an arrow 5, row Ln-1 then finds itself emptied of all charge and row signal Sln controls the transfer of charges that were stored in row Ln and that are then transferred into adjacent row Ln-1, and then the integration period begins for the photosensitive elements of this row Ln-1. Thus it is for each photosensitive surface element of this row Ln-1; each of these photosensitive surface elements produces charges that are added to charges already stored by the illumination at the same point of a same row of the image. Also, continuing in this way up to first row L1 near the readout register, the information projected by the image is integrated n times longer.

The usefulness of a photosensitive sensor operating in the IRC mode consists in the considerable improvement of the signal-to-noise ratio, this ratio being a determining factor for detection. Indeed, if only the dominant noise and the photon noise are considered, the signal is multiplied by n while the noise is multiplied by $\sqrt{n}$. The signal-to-noise ratio is thus increased by the factor $\sqrt{n}$.

As a reminder, on the one hand that, the shift register, which forms the readout register RL, and controlled gates P1 to PM placed between the readout register and photosensitive array BP, are formed on the same semiconductor substrate as photosensitive array BP and, on the other hand, readout register RL and controlled gates P1 to PM are masked by a filter that is opaque to light (visible or near-visible), while the photosensitive elements are exposed to this light to produce more numerous negative charges (electrons) the more intense the illumination. The opaque filter is shown in FIG. 1 by slanted lines designated 14. Array BP thus comprises a photosensitive surface SP divided into photosensitive surface elements $S1_1$ to $SM_n$ forming rows L1 to Ln and columns C1 to CM: row L1 is made of photosensitive surface elements $S1_1$, $S2_1$, $S3_1$..., $SM_1$; row L2 is made of photosensitive surface elements $S1_2$, $S2_2$, $S3_2$, ... $SM_2$, and so on; column C1 is made of surface elements $S1_1$, $S1_2$, $S1_3$, ... $S1_n$; column C2 is made of surface elements $S1_2$, $S2_2$, $S2_3$, ..., $S2_n$ and the same for the other columns. In the nonlimiting case shown in FIG. 1 by way of example, each photosensitive surface element S comprises, in a known way, two electrodes electrically connected to one another, one of which has a threshold voltage different from the other to direct the charge transfer in the direction of arrow 5, thus forming a pair of electrodes made of a transfer electrode ET followed by a storage electrode ES (in the direction of columns C1 to CM), with storage electrode ES beside readout register RL. Thus each column C1 to CM comprises a succession of photosensitive surface elements, each having a storage electrode and a transfer electrode so that each of the columns forms a shift register for charge transfer. If first column C1 is considered, for example following a direction opposite to that shown by arrow 5, starting at first row L1 there is found: a first storage electrode ES1 followed by a first transfer electrode ET1 in first surface element S11; then, at second row L2, a second storage electrode ES2 is found, followed by a second transfer electrode ET2; then a third storage electrode ES3 followed by a third transfer electrode ET3; and so on until last row Ln, where a storage electrode ESn followed by a transfer electrode ETn is found.

The unit operates cyclically with, for each cycle, a control for readout register RL, a control that causes, in the latter, a gradual transfer, toward the readout circuit, of data or charges that were stored in the various columns and that have been discharged in corresponding spaces of readout register RL, this is performed by gate circuits P1 to PM to which there were applied, for this purpose, authorizing pulses SA, authorizing the passage of the charges.

The transfer of charges for each column C1 to CM, from row Ln up to row L1, is obtained using row signal pulses SL1 to SLn. These row signals follow one another with phase deviations that depend on the operation of photosensitive array BP, this operation being able to be conventional, either the two-phase, three-phase, or four-phase type, or, moreover, these pulses can follow one another with a phase such that time $\Delta T$, which separates two successive pulses applied to two adjacent rows, corresponds to the ratio of cycle time TC to number of rows n ($\Delta T = TC/n$); this last type of operation is known by the English expression "ripple clock."

FIG. 2 is a timing diagram showing the phase relation among signals to be applied to a photosensitive array operating in the IRC mode, with eight "ripple clock" phases, i.e., an array comprising eight rows of photosensitive surface elements.

Rows a to h of FIG. 2 show, respectively, row signals SL1 to SL8 made of negative voltage pulses intended to be applied respectively to rows L1 to L8.

Moment t1 marks the start of row signal SL1 applied to first row L1, and moment t2 marks the end of this signal. We mention that first row L1, to which this signal SL1 is applied, is the row closest to readout register RL, and that moment t2 marks the end of the transfer of charges stored at storage electrodes ES1 of this row; these charges being transferred in the corresponding spaces of the readout register. We note that the beginning is thus first row L1 being emptied of its charges, thus leaving it ready to receive charges coming from second row L2.

Signal SL2 applied to second row L2 starts at a moment t3, which follows moment t2 by a time $\Delta t$; the end of pulse SL2 is found at a moment t4 and marks the end of the transfer of charges stored at second row L2, these charges being transferred at the storage electrodes of first row L1; second row L2 thus being freed in its turn.

A similar operation is found for pulses SL3 to SL8, applied respectively to rows L3 to L8 and beginning, respectively, at moments t7, t9, t11, t13, t15; and ending at moments t8, t10, t12, t14, t16.

At a moment t17, found after moment t16, a second pulse SL1' starts that is applied again to first row L1 to discharge the charges contained in the latter in corresponding spaces of the readout register; this pulse SL1' ends at an instant t18.

The time interval between moment t2 and moment t18 corresponds to an integration time Ti of first row L1. It can be thought that a cycle time Tc is between moment t2 and moment t18, which marks the end of second pulse SL1' applied to first row L1.

FIG. 3 shows a column C1 to CM in a diagrammatic, cutaway view, first column C1, for example, and shows the potential profiles at the electrodes of this column, these potential profiles being produced by applying row signals SL to these electrodes; as is customary concerning charge transfer devices, the positive potentials increase toward the bottom.

In the example described, first column C1 comprises 8 pairs of electrodes, ES1 to ES8 and ET1 to ET8, i.e., it belongs to an array comprising 8 rows L1 to L8.

Each pair of electrodes symbolizes a row L1 to L8 and comprises a storage electrode and a transfer electrode, the two electrodes of the same pair being connected together and controlled by the same row signal. Thus there is found successively, starting from the right of the figure in a direction opposite to charge transfer direction 5: an electrode ECs1 that controls first space CS1 of shift register RL; then an electrode EP that represents the controlled gates located between photosensitive array BP and readout register RL; then photosensitive zone or surface SP of column C1 begins, i.e., first storage electrodes ES 1 is followed by first transfer electrode ET1, these two electrodes being connected and intended to receive row signal SL1. Then there is found a second pair of electrodes made of the second storage electrode followed by the second transfer electrode, and so on up to the eighth pair of electrodes formed by an eighth storage electrode Es8 followed by en eighth transfer electrode Et8. These electrodes are carried in a conventional way by a semiconductor substrate 10, by an electrically isolating layer 11 that isolates the electrodes from one another and from substrate 10. Semiconductor substrate 10 can be of silicon, for example, of the P-doped type, but it can comprise, under isolating layer 11, a layer 12 with N-type doping, intended to form, in a conventional way, a buried channel promoting charge transfer.

As we indicated above, the zones corresponding to readout register RL and to the gates authorizing the passage of charges toward the readout register are masked by an optical filter 14, made of aluminum for example, which prevents any illumination of these zones, while photosensitive surfae SP remains exposed to light. This is illustrated in FIG. 3, in which optical filter 14, opaque to light, extends above a zone ZPL protected from light, i.e., above passage electrode P1 and above first space CS1 of readout register RL; the photons are symbolized by wavy arrows 16 that can penetrate up to the substrate to produce charges there; storage and transfer electrodes ES1 to ES8 and ET1 to ET8 being made, for example, of highly doped silicon, they are transparent to light, isolating layer 11 being also transparent to light.

It should be noted that transfer electrodes ET1 to ET 8 produce, in a conventional way, a threshold voltage higher than the storage electrodes to define an isolating wall between rows to orient the direction of the charge transfer as shown by arrow 5, i.e., in the direction starting from storage electrode ES8 toward first storage electrode ES1 and toward shift register EL. This threshold difference can be obtained in a conventional way, for example, by a difference in the doping of the semiconductor material in zones marked N-, which are located at transfer electrodes ET1 to ET8; these zones N- having the same type of conductivity as buried channel 12 with N-type doping, but less doped than the latter.

FIG. 3a is to be read with FIG. 3 and it illustrates the potential profile that exists at transfer and storage electrodes ET1 to ET8 and ES1 to ES8, just before moment t1 mentioned in FIG. 2, i.e., in the absence of row signal; this moment t1 marks the start of the pulse of row signal SL1 applied to first row L1 and subsequently applied to first transfer and storage electrodes ET1, ES1.

Thus, just before moment t1, the potential applied to all the electrodes is a resting potential which, for example, is positive with respect to a reference potential to which substrate is brought. The voltage threshold mentioned above, which transfer electrodes ET1 to ET 8 produce, creates, at these electrodes, a potential VP1 that is more negative than a potential VP2 that is created at storage electrodes ES1 to ES8. As a result, at each storage electrode ES1 to ES8, there is created a potential well PU1 to PU8 whose bottom corresponds to positive potential VP2, and these potential wells are separated by potential barriers B1 to B7 produced, respectively, at transfer electrodes ET1 to ET8; barriers B1 to B7 make it possible to separate the charges (symbolized in the figure by hatch marks) stored at storage electrodes ES1 to ES8 in corresponding potential wells PU1 to PU8. It can be noted that, in charge transfer direction 5, each potential well PU8 to PU1 contains more charges than the preceding potential well; so that just before moment t1, potential well PU1, located at storage electrode ES1, contains all the charges that were successively integrated for the same point of the image during the shifting of the latter.

FIG. 3b illustrates the transfer, in space CS1 of readout register RL, of charges that were contained in first potential well PU1, this charge transfer being completed at moment t2, at which the pulse of row signal SL1 ends: it can be seen that, with the application of row signal SL1, made by a pulse of negative voltage, the potentials at the first transfer electrode and the first storage electrode become more negative and pass respectively to values VP5, VP6, with value VP5 more negative than value VP6, so that potential barrier B1 is maintained and prevents the charges that were contained in first potential well PU1 from returning to second potential well PU2. In contrast, following a pulse of positive voltage applied to gate electrodes EP, the resting potential at the latter becomes more negative and of a value, for example VP7, which it had before moment t1 when it formed a potential barrier BPP, it passes to a more positive value, for example VP1, so that it does not form an obstacle to discharging, in space CS1 of the readout register, of the charges that were originally contained at first storage electrode ES1, i.e., in first potential well PU1.

FIG. 3c shows the potential profile between moment t2 and moment t3, represented in FIG. 2; it can be seen that potential well PU1 at first storage electrode ES1 has been emptied of its charges, and consequently it is ready to receive the charges stored in preceding potential well PU2, located at second storage electrode ES2.

FIG. 3d illustrates the transfer, into first potential well PU1, of charges that, before moment t3, were contained in second potential well PU2: between moment t3 and t4 (represented in FIG. 2), signal SL2, made of a pulse of negative voltage, is applied to second transfer and storage electrodes ET2, ES2 and the potentials at these electrodes pass to more negative values, respectively from VP2 to VP5 and from VP1 to VP6, as in the case of the preceding example. The result is that at moment t4 (shown in FIG. 2), the charges that were originally contained in second potential well PU2 are again stored in first potential well PU1.

FIG. 3e shows that, at moment t4 (illustrated in FIG. 2), second potential well PU2 is empty, and it is able, as a result, to receive the charges contained in the potential well preceding it, i.e., third potential well PU3 formed at third storage electrode ES3.

FIG. 3f illustrates the variations of potential produced at third transfer and storage electrodes ET3, ES3 by applying the pulse of negative voltage, of which row signal SL3 is made, applied to these third electrodes and which leads to transferring, in second potential well PU2, the charges that were contained in third potential well PU3; this is according to the same type of operation as in the preceding examples.

These operations are repeated in a similar manner (not shown) successively to transfer the charges contained in potential wells PU4, PU5, PU6, PU7 and PU8. The subsequent discharge, in space CS1 of readout register RL, of the charges contained in first potential well PU1 is performed, in a way similar to that shown in FIG. 3b, between moments t17 and t18 (shown in FIG. 2) at which a new row signal SL1' is again applied to first row L1, i.e., to first transfer and storage electrodes ET1, ES1. It should be noted that, between these two successive transfer operations in the spaces of register RL of the charges that were stored in first potential well PU1, the readout register was activated so as to advance gradually, toward readout circuit CL (shown in FIG. 1), all the charges that were stored in spaces CS1 to CSM.

This operation and this configuration of a photosensitive device operating in the integration and charge carry mode are conventional in the art. But this configuration produces a major drawback that consists in an especially significant smearing effect that can affect the entire image.

SUMMARY OF THE INVENTION

The present invention ascribes this phenomenon of the smearing effect to a contamination of the readout register due to too small a distance between readout register RL and the photon-permeable zone, i.e., photosensitive surface SP. The incident photons, in the photosensitive zone, penetrate substrate 10, where they generate electron-hole pairs and, when the holes are recombined with the substrate, the electrons (symbolized in FIG. 3 by vectors in dotted lines 20) escape from the space charge regions (or potential wells) present at the electrodes and diffuse until they are captured or recombined. As a result these electrons, when they are generated in the photosensitive zone but near the readout register, cause a contamination of the latter, which leads to a degradation of the data contained in the readout register, this degradation being visible on the entire row of the image, notably when the readout register collects these parasitic charges while the data are being carried toward the output circuit.

This smearing effect, often referred to by the English term "smearing," is of course all the more disruptive the larger the quantity of charges thus generated in the substrate is; it should be noted, moreover, that the most degradation occurs when the wavelength of the photons increases toward the infrared.

The invention relates to a photosensitive semiconductor device of the charge transfer type and particularly (but not exclusively) of the linear array type comprising several photosensitive rows and operating according to the integration and charge carry mode. The object of the invention is in particular to reduce, even to eliminate, the drawback of smearing mentioned above without, at the same time, significantly reducing integration time Ti or the operating speed. The invention can be applied to devices operating in two phases or in three phases, four phases or n phases in the ripple clock mode, as described above; the invention can also be applied to frame transfer, single shot, line-space-type devices, etc.

. . .

According to the invention, a photosensitive device comprising, on the same semiconductor substrate, a photosensitive surface, a readout register of the charge transfer type bordering the photosensitive surface, a filter that is opaque to light placed between the light and a zone of the substrate where the readout register is made so as to form a zone protected from light, the photosensitive surface being divided into numerous photosensitive surface elements each able to produce charges when exposed to light, the photosensitive surface elements being placed in columns and in at least one row, each surface element comprising at least one storage electrode and one transfer electrode placed in series in the direction of the columns so as to transfer charges along these columns toward the readout register under the control of row signals applied to these electrodes, is characterized in that it comprises, furthermore, an intermediate zone protected from light and placed between the readout register and the row of photosensitive surface elements closest to this readout register, and in that at least one intermediate transfer stage is placed in the intermediate zone between the end of each column C1 to Cm and a corresponding space (CS1 to CSM) of readout register (RL), so as to guarantee the transfer of charges in the intermediate zone under the control of transfer pulses (ST) applied at the intermediate transfer stages.

BRIEF DESCRIPTION OF THE DRAWINGS

The characteristics and advantages of the invention will come out better from the following description, given by way of nonlimiting example, referring to the attached drawings in which:

FIG. 3a to 3f show potential profiles;

FIG. 5a to g is a timing diagram that illustrates the operation of the photosensitive device according to the invention.

FIG. 4 shows, partially, a photosensitive device 30 according to the invention. In the nonlimiting example described, photosensitive device 30 is represented by a photosensitive zone or surface SP belonging to a photosensitive array of the type shown in FIG. 1, i.e., comprising numerous rows L1 to Ln and operating by integration and charge carry, as was explained above; the charges produced by the photosensitive surface elements being transferred in the spaces of a readout register by a gate circuit, as mentioned above.

Figure 1:
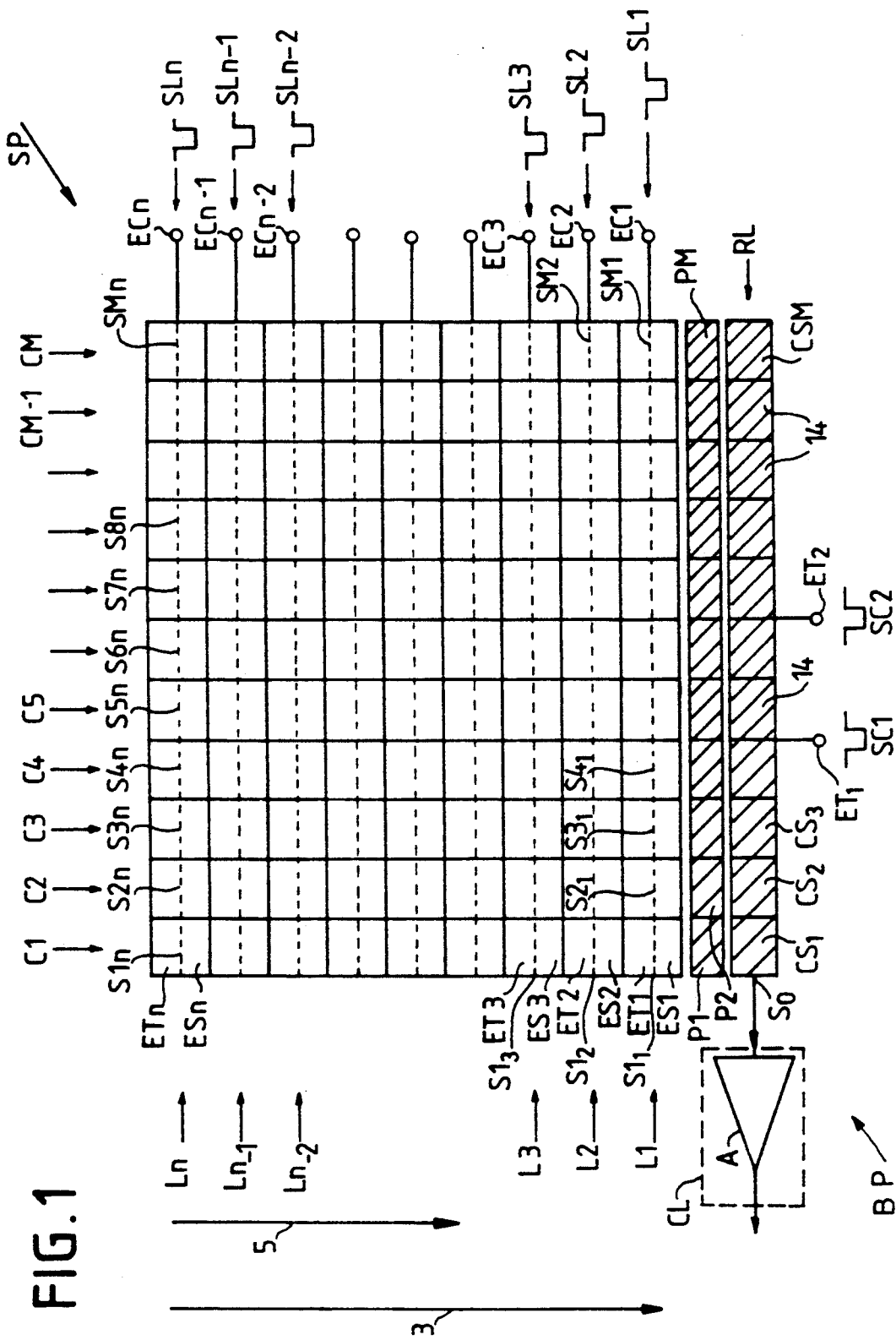
FIG. 1, already described, shows the general organization of a photosensitive array of the IRC type.
Figure 2:
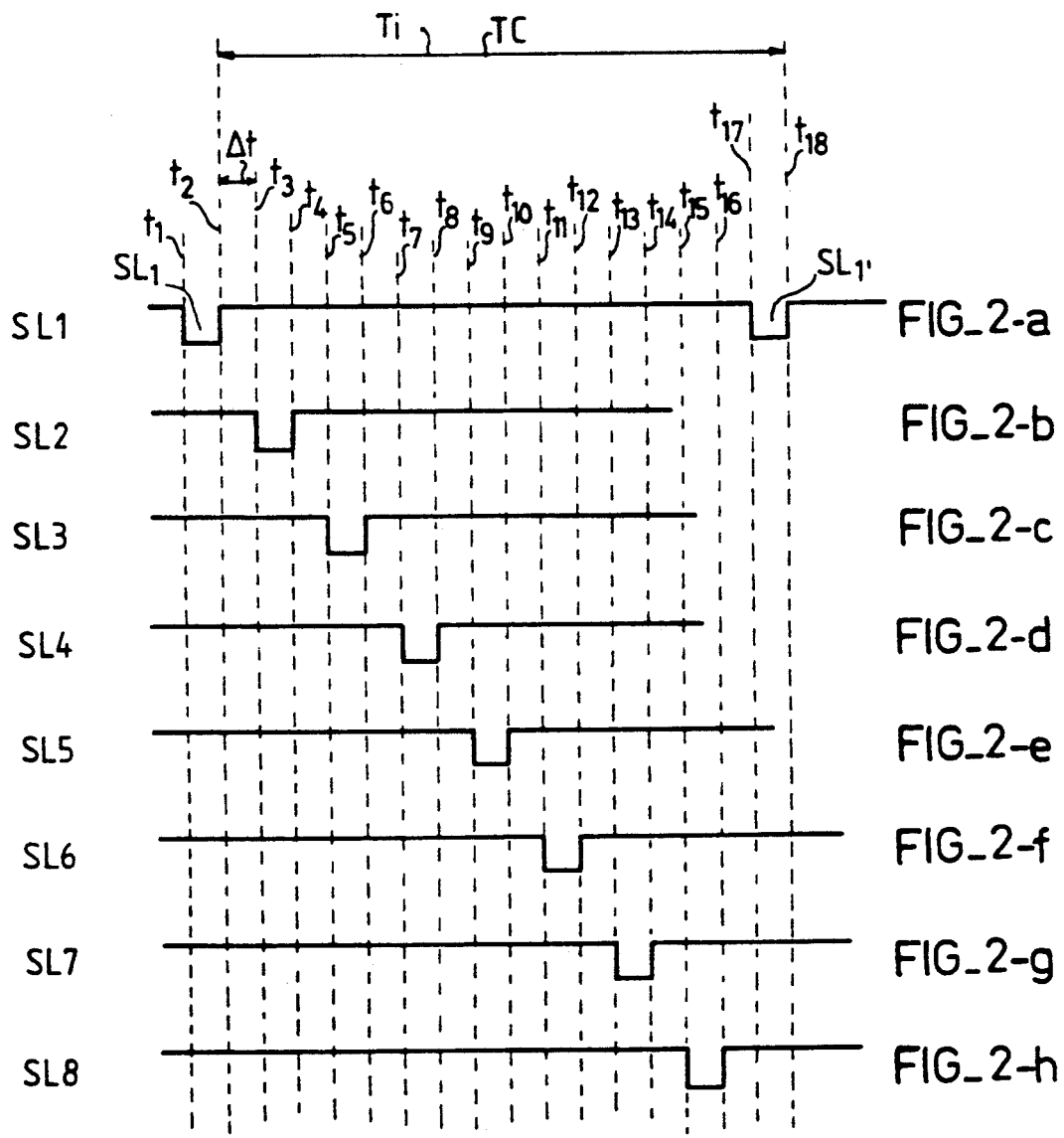
FIG. 2a-h, already described, illustrates the signals that are to be applied to a device such as the one shown in FIG. 1, and operating in IRC mode.
Figure 3:
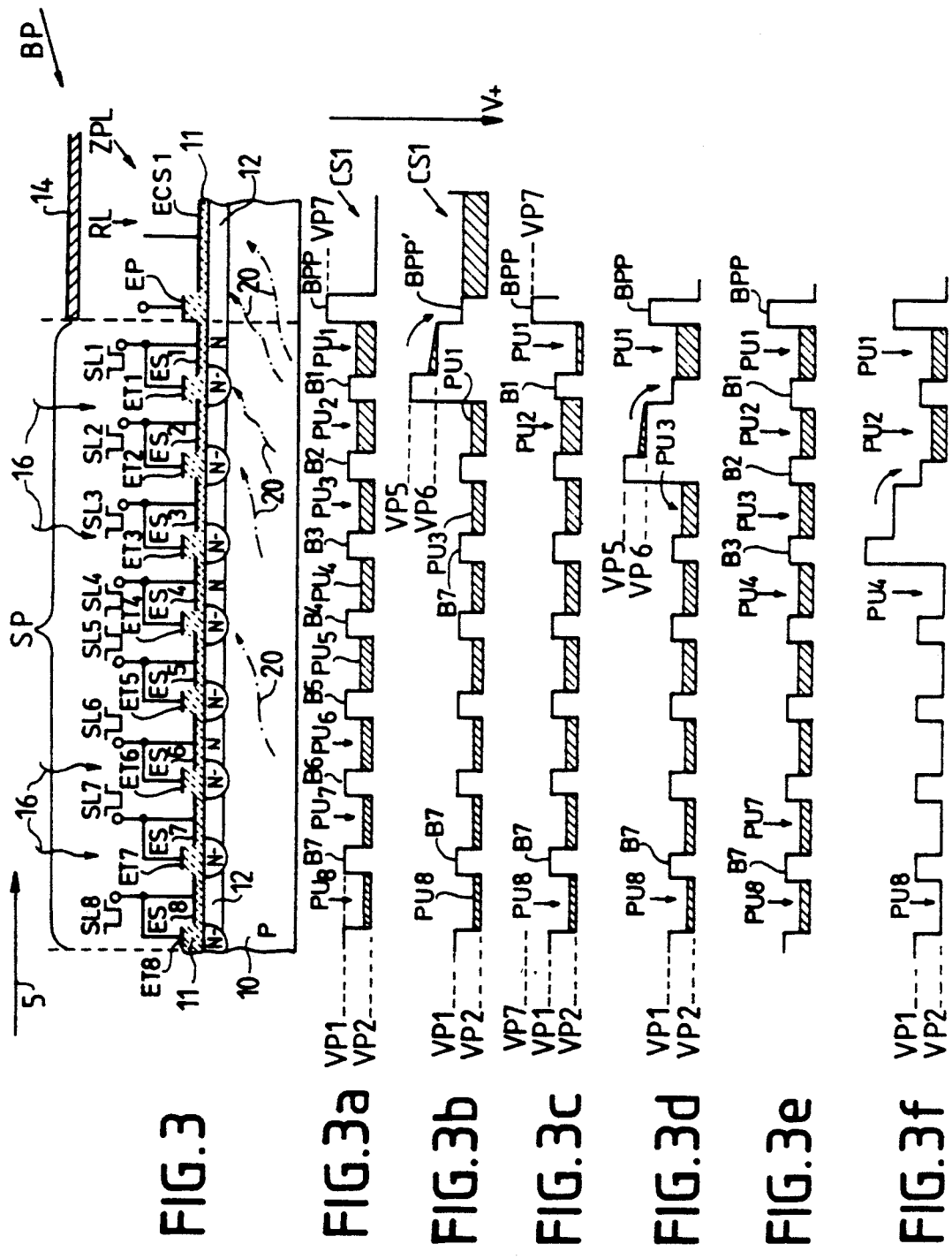
FIG. 3, already described, is a cutaway view which, on the one hand, shows a photosensitive zone in the direction of one column shown in FIG. 1 and, on the other hand, makes it possible to illustrate potential profiles obtained in this photosensitive zone by applying pulses shown in FIG. 2.
Figure 4:
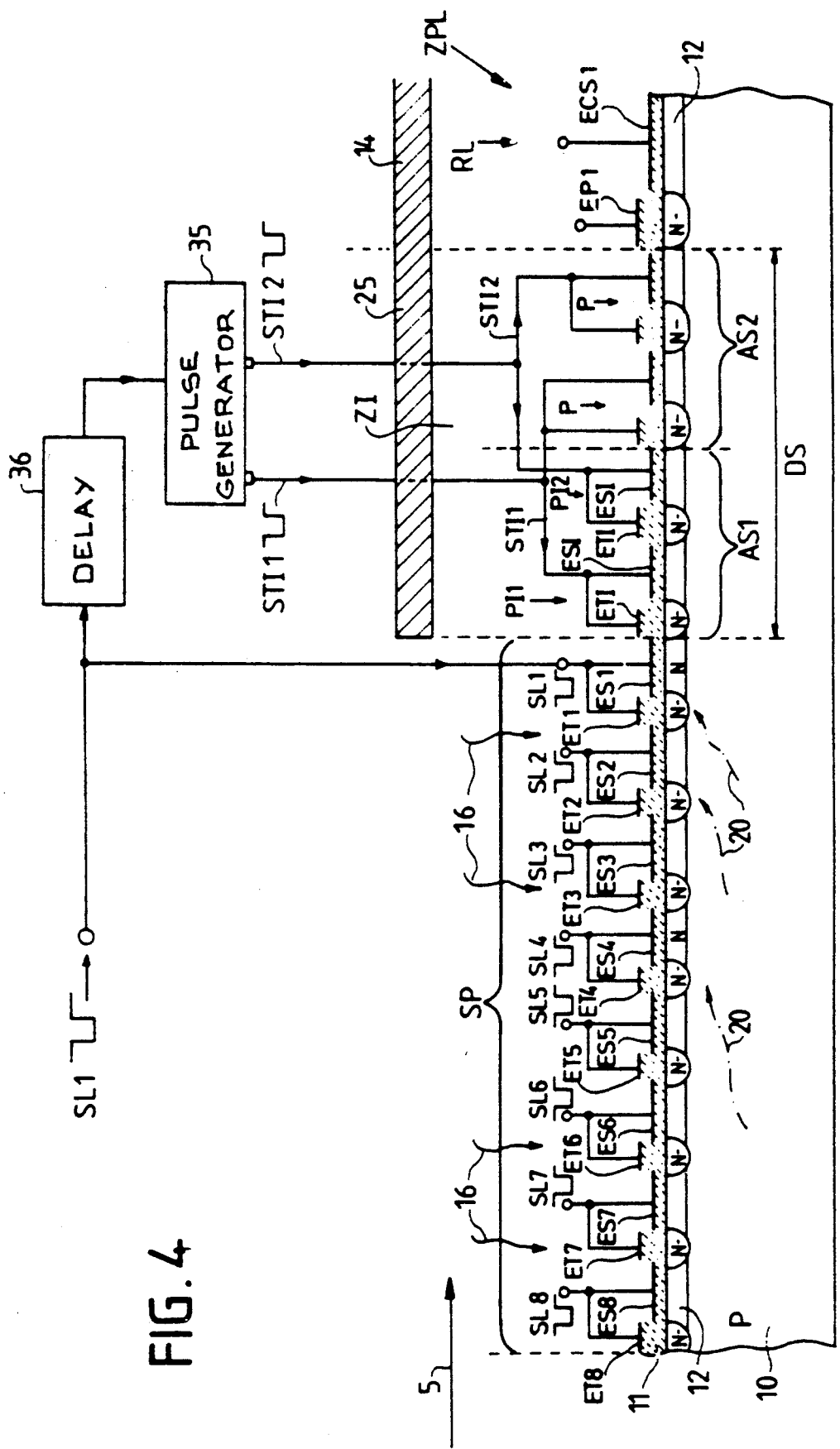
FIG. 4 shows in particular a cutaway view of the same photosensitive zone as the one shown in FIG. 3, and illustrates a preferred embodiment of the invention.

Photosensitive surface SP of array BP is illustrated in FIG. 4 by a cutaway view along one column such as, for example, first column C1 shown in FIG. 3.

Compared to the arrangement shown in FIG. 3, FIG. 4 shows, furthermore, characteristic means of the invention. These means consist notably of an intermediate zone ZI protected from light. This intermediate zone ZI is located between zone ZPL, protected from light (a zone containing readout register RL and passage gates P1 to PM), and the end of columns C1 to CM pointed toward readout register RL, i.e., the end formed by row L1 of surface elements.

Thus in FIG. 4 there is found a substrate 10, similar to that of FIG. 3, and carrying transfer and storage electrodes of first column C1. Starting from the left of the figure toward the right in transfer direction 5, there are found: eighth transfer electrode ET8 followed by the eighth storage electrode to which it is electrically connected; then seventh transfer and storage electrodes ET2, ES2, connected to one another, and so on up to first transfer electrode ET1 followed by first storage electrode ES1. These eight pairs of electrodes represent photosensitive zone or surface SP exposed to photons 16 and each pair symbolizes a row L8, L7, . . . , L3, L2, L1, each of these rows receiving a row signal SL8, SL2, SL1 as explained above. Then there is found, again in the transfer direction shown by arrow 5, intermediate zone ZI not exposed to light, i.e., photons 16 cannot penetrate into the substrate section corresponding to this intermediate zone and cannot, consequently, produce charges there that can migrate toward readout register RL and consequently contaminate the latter as was explained to indicate the defect of the prior art. In the nonlimiting example of the description, this intermediate zone ZI is protected from light or radiation to which photosensitive surface SP is sensitive, by a filter 25 that is opaque to this light, of aluminum for example, that is placed between the light and substrate 10. In the nonlimiting example described, filter 25 is made of an elongation of first opaque filter 14, but of course it can be made in any other way.

Intermediate zone ZI comprises one or more intermediate transfer and storage electrodes ET1, ES1 that elongate each column C1 to CM and that are intended to perform the charge transfer from first storage electrode ES1 up to corresponding space CS1 to CSM of readout register RL, i.e., in the example of FIG. 4, up to storage electrode ESC1; this is performed crossing intermediate zone ZI, then gates P1 to PM. Intermediate electrodes ET1, ES1 constitute at least one intermediate transfer stage AS1, AS2, forming a separation stage that makes it possible to considerably separate, by a separation distance DS, readout register RL and photosensitive surface SP.

In the nonlimiting example described, separation distance Ds between photosensitive surface SP and readout register RL or, more precisely, between photosensitive surface SP and gates P1 to PM, is obtained with the help of two successive intermediate transfer stages AS1, AS2, each operating in two-phase mode. In the nonlimiting example of the description, each intermediate transfer stage AS1, AS2 comprises, in transfer direction 5, an intermediate transfer electrode ETI followed by an intermediate storage electrode ES1, these two electrodes being connected to one another. First and second pairs PI1, PI2 of each intermediate stage AS1, AS2 receive intermediate transfer control signals STI1, STI2, respectively, having the same frequency but opposite phases.

Considering the fact that two intermediate transfer stages AS1, AS2 are represented, first electrode pairs PI1 of the two intermediate stages are connected to one another to receive intermediate transfer signals STI1 having a given phase, and second pairs PI2 are connected to one another to receive intermediate transfer signals STI2 having the opposite phase.

Of course, if separation distance Ds is judged insufficient, the number of intermediate stages SA1, SA2 can be increased, or the path along which the electrodes of these stages are placed can be modified.

Tests have shown that by inserting, as shown in FIG. 4, two intermediate transfer stages (to achieve, for example, a distance DS on the order of 50 to 100 micrometers), the smearing effect that is produced in the prior art between the photosensitive surface and the readout register can be almost totally eliminated.

The voltage signals such as, for example, row signals SL1 to SL8 are supplied with the suitable phase by a control device conventional in the art (not shown) that can also be used to supply intermediate transfer signals STI1, STI2.

However, these latter signals can be supplied using a different generator, so as to make possible a control that is separate from intermediate electrodes ET1, ES1, notably to make possible a control independent of these electrodes of the intermediate zone. This can prevent the introduction of idle time between the time allocated to the transfer between rows L1 to Ln, i.e., to the transfer in the direction of the columns, and the time allocated to obtain a video output signal, i.e., the time allocated for the operation of the shift register that constitutes readout register RL. Then it is also possible to achieve intermediate stages having any number of electrode pairs (a pair of electrodes corresponds to a transfer electrode connected to a storage electrode) and to make the electrodes of this intermediate zone operate any control mode (by any control mode refers to: a two-phase, three-phase, or four-phase or ripple clock, or even single-phase type of control).

FIG. 4 illustrates the case in which intermediate transfer pulses STI1, STI2 can be supplied at a frequency different from that of the other signals. For this purpose, in the nonlimiting example of the description, row signals SL1, applied to the electrodes of first row L1, i.e., to first transfer and storage electrodes ET1, ES1, are also applied to a pulse generator 35 by a delay circuit 36, so that generator 35 supplies pulses STI1, STI2 under the control of row signals SL1, and with an appropriate delay defined by delay circuit 36.

FIGS. 5a to 5f illustrate the operation of a photosensitive array according to the invention, such as is represented, for example, in FIG. 4.

Moment t1 marks the start of signal SL1 (FIG. 5a) applied to first transfer and storage electrodes ET1, ES1 of row L1, and this row signal ends at moment t2: integration time Ti1 of the photosensitive surface elements of row L1 starts at moment t2.

It can be seen in FIG. 5d that, at moment t3, a negative voltage pulse starts that corresponds to the start of an intermediate transfer signal STI1 applied to first electrode pairs PI1 of two intermediate transfer stages AS1, AS2. At the same moment t3, a positive voltage pulse starts (FIG. 5e), which forms intermediate transfer signal STI2 applied to second electrode pairs PI2 of each transfer stage AS1, AS2.

Moment t4 marks the end of signals STI1, STI2 (FIGS. 5d and 5e); and moment t4 marks the start of control pulse SA of gates P1 to PM (FIG. 5f), which authorizes the passage of charges toward the readout register. At moment t5, a second pulse STI1 and a second pulse STI2 start, and they end at moment t6. On the one hand, time T1 between two successive pulses STI1, STI2, used for transferring charges in intermediate zone ZI, can be very short, on the order of a microsecond, for example, i.e., very much shorter than integration time Ti that separates two successive pulses applied to the same electrode in the photosensitive zone. It can be on the other hand, between the end of row signal SL1, applied to first transfer and storage electrodes ET1, ES1, and the start of intermediate signals STI1, STI2, there is a period that can be very short, on the order of 0.5 microseconds, for example, i.e., very much shorter than time T2 that separates the end of row signal SL1 applied to first transfer and storage electrodes ET1, ES1 at the start of row signal SL2 (FIG. 5b) applied to second transfer and storage electrodes ET2, ES2.

At moment t7, the charges are already stored in readout register RL and moment t7 marks the end of authorization signal SA for the passage of charges.

After loading the readout register, the latter can normally shift the charges toward the output circuit where these charges are read in the conventional way, the shifting of the charges being performed during a readout time TL (FIG. 5g). Readout time TL starts at a moment t8 that follows the end of authorization signal SA for the passage of charges; the shifting of the charges being performed under the control of shift pulses SC1, SC2, with opposite phases, which are applied to readout register RL and which follow one another at a relatively high frequency during entire readout time TL; by way of example, only pulses SC1 during readout time TL were shown.

During readout time TL, other rows L2 to Ln of the photosensitive array each receive, successively, row signals SL2, SLn that are allocated to them: thus, at moment t9, there begins row signal SL2 that is applied to second transfer and storage electrodes ET2, ES2 that belong to second row L2: this pulse SL2 ends at a moment t10, at which integration time Ti2, for all the photosensitive surfaces belonging to second row L2, begins. The same is true for all the other row signals (not shown) applied to the electrodes of other rows up to last row Ln which, at a moment t11, receives row signal SLn (FIG. 5c) that ends at a moment t12.

Readout time TL, or the time allocated to the shifting of readout register RL, ends at a moment t13 that follows moment t12.

Between a moment t1' and a moment t2', a new row signal SL1' is applied to first transfer and storage electrodes ET1, ES1. Moment t2' marks the end of integration time Ti1 of first row L1, and this moment t2' can be considered as the end of the cycle and as the start of a new cycle, similar to the one that was just described.

FIGS. 5a to 5g form a timing diagram that shows an example of the operation in IRC mode of a photosensitive array, and notably shows that realizing the invention makes it possible to reduce the smearing effect without introducing significant idle time into the transfers between first row L1 and readout register.

Of course, the invention can be applied to photosensitive devices different from the one described above described by way of nonlimiting example, and modifications of this timing diagram can be made without departing the framework of the invention, for example, to the relative positions in time between authorization and passage signals SA, intermediate transfer signals STI1, STI2, shift control pulses SC1, etc.

I claim:

1. A photosensitive device, comprising, on a semiconductor substrate:

a photosensitive surface;

a readout register of the charge transfer type bearing said photosensitive surface, said readout register being located in a zone protected from light and said photosensitive surface being divided into a plurality of photosensitive surface elements each of said photosensitive elements producing charges when exposed to light;

a plurality of surface elements forming at least one row, each of said plurality of surface elements having at least one storage electrode and one transfer electrode placed in series so as to provide a column and to make it possible to transfer charges along the column toward a readout register under the control of row signals applied to said at least one storage electrode and said at least one transfer electrode, said charges being transferred in said readout register in a space corresponding to each column;

said photosensitive device further comprising:

means to form an intermediate zone protected from light and located between said photosensitive surface and said zone protected from light;

at least one intermediate transfer stage comprising at least one of said at least one storage electrode and at least one said at least one transfer electrode, said transfer stage being placed in an intermediate zone between each said column and each corresponding said space of said readout register in order ensure the transfer of charges between each column and the out register when acted on by intermediate transfer signals applied to said at least one storage electrode and said at least one transfer electrodes of said intermediate transfer stage; and transfer pulse applying means for applying transfer pulses to the electrodes of said at least one intermediate transfer stage in a controlled mode independent of a mode used to apply row signals to the electrodes of said photosensitive surface, wherein a first row signal is applied to one of said storage electrodes and one of said transfer electrode of a first row and a second row signal is applied to another one of said storage electrodes and another one of said transfer electrodes of a second row adjacent to said first row, and wherein a time between said first row and said second row signal is longer than a time separating a first one and a second one of said transfer pulses.

2. Photosensitive device according to claim 1, wherein photosensitive surface forms the photosensitive surface of a photosensitive array.

3. Photosensitive device according to one of the preceding claims 1 or 2, wherein photosensitive surface comprises several rows of photosensitive surface elements.

4. Photosensitive device according to any one of claims 1 or 2, wherein a filter that is opaque to light is placed between the light and substrate of intermediate zone (ZI).

5. Photosensitive device according to claim 4, wherein opaque filter is placed above the electrodes belonging to said transfer stage.

6. Photosensitive device according to claim 1, wherein said intermediate transfer stage comprises at least one electrode pair made of a transfer electrode followed by an intermediate storage electrode.

* * * * *